United States Patent [19]
Keen et al.

[11] Patent Number: 5,254,992
[45] Date of Patent: Oct. 19, 1993

[54] LOW POWER ELECTRONIC MEASURING SYSTEM

[75] Inventors: Harry J. Keen, St. Johnsbury; Leon E. Saucier, South Rygate, both of Vt.

[73] Assignee: Fairbanks Inc., Kansas City, Mo.

[21] Appl. No.: 785,539

[22] Filed: Oct. 31, 1991

[51] Int. Cl.⁵ ............ H03M 1/06; G01G 3/14
[52] U.S. Cl. .................. 341/119; 341/126; 177/DIG. 3; 177/210 R; 307/152
[58] Field of Search ............ 341/119, 110, 126; 177/DIG. 3, 25.11, 25.12, 25.13, 210 R, 211; 307/152

[56] References Cited
U.S. PATENT DOCUMENTS
4,238,784 12/1980 Keen et al. ............ 341/126

*Primary Examiner*—Sharon D. Logan
*Attorney, Agent, or Firm*—Bryan Cave

[57] ABSTRACT

A microprocessor (8) controlled power-saving electronic measuring system is disclosed. A load cell (1) generates an output signal indicative of the magnitude of the load applied to the cell (1). A DC power supply (2) is switched to supply the load cell (1) with power pulses (10) at varying frequencies and duty cycles determinable by the microprocessor (8) to optimize battery life. The microprocessor (8) determines the optimal duty cycle and frequency for the power pulses responsive to desired parameters. The circuitry of the present invention is located in close proximity to a temperature sensor (34) which accurately reads the temperatures of all of the components and compensates for all heat related inaccuracies simultaneously. The microprocessor (8) determines a temperature corrected value for the load cell (1) output via a previously programmed table containing the temperature response characteristics for the load cell (1) and the circuitry. In an over/under indicator mode, segments of the display (36) LED's are configured to graphically indicate whether the current weight on the scale is within a desired tolerance. A power saving sleep mode in described in which the system voltage level is reduced, and most of the circuitry is disabled.

29 Claims, 7 Drawing Sheets

LOW POWER ELECTRONIC MEASURING SYSTEM

BACKGROUND OF THE INVENTION

I. Field of the Invention

The present invention relates generally to electronic measuring systems, and more particularly to an electronic scale employing a variable duty cycle pulsed power supply and which compensates for transducer and component temperature variation with a single temperature sensor.

II. Description of the Prior Art

Electronic systems which measure weight are commonly known. Typically, in an electronic scale, a continuous voltage is applied across a load cell arranged in a wheatstone bridge. The voltage across the load cell output is measured, from which the magnitude of the load applied to the cell is determined.

In a battery operated scale, it is desirable to minimize power consumption to extend battery life. In early electronic scales, the electrical components and the load cell each used comparatively large amounts of power. With the advent of digital circuitry, the power consumption of the logic components began to shrink as compared to the load cell. Thus, systems were developed to reduce load cell power consumption.

Keen et al., U.S. Pat. No. 4,238,784 discloses an electronic measuring system with a constant dual-frequency pulsed power supply. The system pulses the power at the load cell input, thereby utilizing lower power than with a continuous D.C. power supply. The use of pulsed power was also found to reduce the operating temperature of the transducer. This results in a lower steady-state operating temperature, and therefore reduces heat related error and eliminates the need for system warm-up.

Even with pulsed systems, the zero reading of the transducer tends to drift. This effect is ordinarily caused by temperature changes in the system, and by residual voltages in the system during a no-pulse cycle. Various techniques have been applied to compensate for drift, such as disclosed in U.S. Pat. No. 4,238,784 in which drift is compensated for by storing in a capacitor the residual voltages in the electronic components which remain during a no-pulse. This value, representative of system drift, is then subtracted from the sensor output voltage during a pulse. This results in a transducer output compensated for residual error voltages; however, although satisfactory in some circumstances, this system does not enable the pulses to be varied with respect to duty cycle and frequency to thereby further reduce power consumption to lower desired levels.

In order to try to compensate for effects caused by temperature changes, prior art battery operated scales employed separate temperature sensors for the separately housed detection and display circuitry. Such a prior art arrangement has not only resulted in increased cost, but has also resulted in reduction in correction accuracy.

Such prior art electronic scales have been used in the past as checkweight indicators in which the scale is used to determine whether the weight of an object is within a prescribed tolerance (i.e. over a minimum weight, and under a maximum weight), not its precise weight. These prior art scales generally incorporate separate display elements to indicate an over/under condition, usually a series of LED's. Such a prior art configuration again, not only adds cost to the scale by requiring the additional display elements and space on the display face, but the LED's employed also increase the power consumed by the system, and further exacerbate the unwanted problem of heat in the circuitry housing.

These disadvantages of the prior art are overcome by the present invention.

SUMMARY OF THE INVENTION

The present invention is a microprocessor controlled low power electronic measuring system in which a load cell is employed which generates an output signal indicative of the magnitude of the load applied to the cell and a DC power supply is switched to supply the load cell with power pulses at varying frequencies and duty cycles determinable by the microprocessor to optimize battery life.

In order to conserve power, the desired resolution of the system is programmable. The microprocessor determines the optimal duty cycle and frequency for the power pulses responsive to the desired resolution. Also, the system can change its resolution in response to the desired application. Thus, if low resolution is desired, the microprocessor will trigger lower frequency and/or smaller duty cycle DC pulses. This conserves power and reduces heating of the load cell. For higher resolution applications, the microprocessor will trigger pulses with higher frequency and/or longer duty cycle. This feature permits the electronic measuring system of the present invention to operate in a portable mode with extended battery life.

The analog output signal from the load cell is amplified by an operational amplifier and is then applied to an automatic drift correction circuit, such as the type of circuit described in U.S. Pat. No. 4,238,784. The drift correction circuit compensates for any residual voltages in the circuitry, and the output therefrom is a true zero for the system.

The corrected amplified load cell output preferably passes to a microprocessor switched sample-and-hold ("S/H") circuit where it is stored while the power pulse is turned off. The output of the sample and hold is then fed through a low pass filter to reduce the noise content of the signal. This signal is then fed to an analog-to-digital converter ("A/D") where it is converted to a digital value. This digital value is representative of the load applied to the load cell.

In the presently preferred system of the present invention, the load cell, the analog and digital circuitry, and the display devices are all located in a common housing or in close proximity and a single or common temperature sensor is employed to simultaneously monitor the temperatures of all of the components and, thus, simultaneously compensate for all heat related inaccuracies. By placing the components in a common housing, costs are reduced by limiting the number of temperature sensors to one, and accuracy is increased by eliminating the need to separately compensate for temperature changes in each of the various components.

To read the temperature changes, the microprocessor switches the input to the A/D converter in a manner so that the temperature output signal from the temperature sensor is converted in the A/D converter to a digital signal for processing in the microprocessor. Thus, only one A/D converter is required.

The microprocessor is preferably programmed with the temperature response characteristics for the load cell and the circuitry. The microprocessor determines the value of the load applied to the load cell by biasing the actual digital load cell signal by an amount corresponding to the temperature offset. Thus the microprocessor provides an accurate load reading for the entire system with a single or common temperature sensor.

The microprocessor also includes circuitry for driving seven-segment LCD displays. In normal operation, once the weight of the load on the load cell has been determined, the microprocessor displays in an LCD display panel the weight of the load.

If desired, the presently preferred system may be employed in an over/under checkweight indicator, in which instance the segments of the normal LCD weight display are preferably configured to indicate whether the current weight on the scale is within a desired tolerance. If the weight is below the threshold, the LCD's indicate an under condition, and within a proximity, may also indicate how far below the tolerance level. Likewise, if the weight of the object is above the desired level, the LCD elements graphically depict how far above the threshold that the weight is.

By utilizing the weight display elements as the over-/under indicator, it is not necessary to provide a separate indicator for this purpose. Thus, a cost savings is realized. Further, separate drivers for the over/under indicator elements are not necessary, since the driver for these is contained in the microprocessor. A further advantage of utilizing the LCD display segments is their ability to emulate rudimentary graphical functions. The system of the present invention therefore provides more readily understandable displays having increased information content.

The present invention also includes a power saving sleep mode in addition to the common on and off modes. During the sleep mode, the system voltage level is reduced, and most of the circuitry is disabled except for those components necessary to monitor scale activity. This feature significantly reduces system power consumption.

DESCRIPTION OF THE PREFERRED EMBODIMENT

Figure 1:
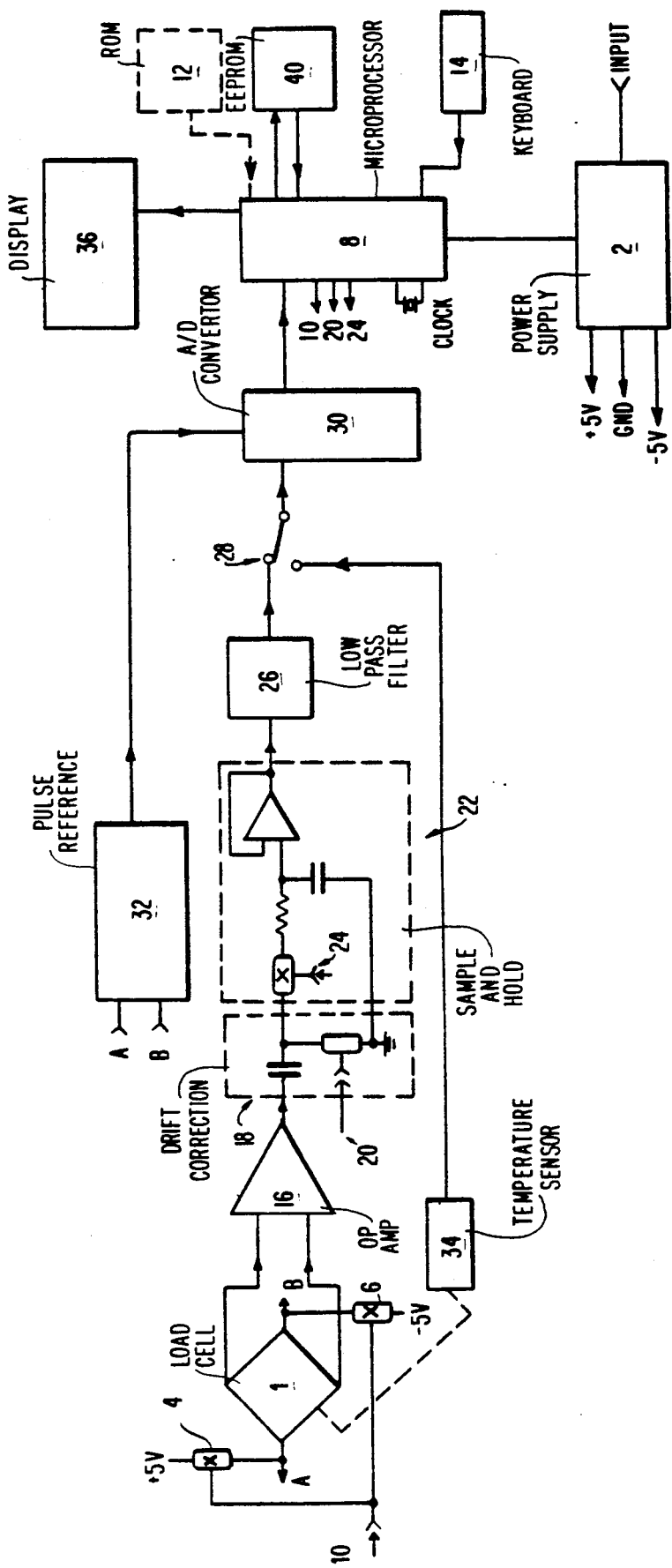
FIG. 1 shows a block diagram of the electronic measuring system of the present invention.

Referring now to the drawings in detail, and initially to FIG. 1, the electronic measuring system of the present invention employs a load cell 1 to measure the weight of an object. Load cell 1 is a conventional load measuring device conventionally arranged in a bridge circuit. A pulsed voltage is applied across terminals A and B, to excite load cell 1, and output terminals C and D register a voltage corresponding with the load applied to the cell.

The excitation voltage driving load cell 1 is provided by a power supply 2. Power supply 2 may be any conventional DC power supply or battery, or any power supply which is altered to provide a D.C. voltage. For example, a conventional 120 volt, 60 Hertz AC power supply could be rectified and converted to provide the desired DC voltage levels. Switches 4 and 6 operatively determine when power is supplied to terminals A and B from power supply 2. When switches 4 and 6 are enabled via a pulse signal line 10, the voltage from power supply 2 is provided at terminals A and B. When pulse signal line 10 is deactivated, power supply 2 is isolated from load cell 1.

In a preferred embodiment, the constant DC voltage to switches 4 and 6, by way of example, is $+5$ V and $-5$ V respectively. These voltages may vary provided that they are DC, and that the corresponding circuitry is modified accordingly, i.e. resistors and amplifiers adjusted to obtain the proper readings. It is readily foreseen that a power supply of any appropriate voltage for the system circuitry may be used.

The system includes a conventional microprocessor 8 which handles many of the unique functions of the present invention. Previous systems known to applicants, such as disclosed in U.S. Pat. No. 4,238,784, employed electronic circuitry which produced power pulses at a fixed frequency and duty cycle. The duty cycle of the system is the ratio of working time, the time during which power is being pulsed, to the total time. The frequency is the time between successive pulses. It has been found to be advantageous in portable applications to modify the frequency and duty cycle of the pulses at the load cell to maximize battery life while providing only the minimum necessary scale resolution. Higher scale resolution requires a larger duty cycle to allow the circuitry sufficient time to accurately sample the load cell output. When the system is used to obtain higher resolution of the load, it consumes more power which results in shorter battery life. Conversely, for lower resolution, the system requires a lower duty cycle. Thus, lower resolution output results in increased system battery life.

Taking advantage of this principle, the system of the present invention preferably includes a program stored in ROM 12 which allows the desired resolution of the scale to be preset via data entry device 14 located on a front panel of the system. If desired, the system could include factory preset resolution options, or interface with a computer device to receive such commands.

In practice, the user will determine a preferred resolution of the scale to maximize informational importance while minimizing power consumption. For example, if the desired accuracy of the system is 1/1000th of the range (i.e. range of 100 lbs., accurate to the nearest pound), the user would enter these values into the system via the keyboard 14. The microprocessor 8 would then preferably utilize these values, plus other information described hereinafter to determine the minimum necessary pulse rate for the load cell.

Having determined the optimal frequency and duty cycle for the application, microprocessor 8 preferably sends a series of signals via pulse signal line 10 to switches 4 and 6 for preferably alternatively switching the power to load cell 1 on and off at the correct times. The system preserves power by pulsing the load cell only as necessary. Thus, for high resolutions, the system may pulse several hundred times per second whereas it will pulse much slower for lower resolution applications.

The analog output from load cell 1 at terminals C and D is amplified by operational amplifier 16 and is then applied to a drift correction circuit 18. While the system is between pulses, drift correction circuit 18 stores in a capacitor any residual voltages which remain in the circuitry. Since during a no-pulse, the amplifier output should be zero, any residual voltages would tend to render subsequent output voltage readings inaccurate. Drift correction circuit 18 stores a reading of the residual voltages at the amplifier output, and subtracts this value from the output of the amplifier during the next pulse. Thus, an accurate zero reading is provided.

Drift correction circuit 18 is preferably controlled by the zero signal 20 generated by microprocessor 8. When the zero signal 20 is activated, a reading of voltage offsets will be taken. As the system duty cycle or frequency changes, microprocessor 8 preferably varies the timing signals to the system components accordingly. At higher duty cycles, zero corrections are needed more often.

The output of the drift correction circuit 18 is fed to a sample-and-hold ("S/H") circuit 22. When signalled by microprocessor 8 via S/H signal line 24, the S/H circuit 22 reads and stores the zeroed analog load cell output signal. Once the amplified output has been stored in the S/H circuit 22, microprocessor 8 may turn off the pulse signal line 10 and the S/H signal line 24, and may thereafter engage the zero signal 20.

The output of the S/H circuit 22 is directed through low pass filter 26. Since the input voltage is DC, any signal content which is oscillating must be noise. Generally, such noise is caused by physical oscillation of the scale, or by power supply noise. Low pass filter 26 clips all noise above a very low frequency before directing the filtered output through two-input switch 28 into analog-to-digital ("A/D") converter 30.

In order for A/D converter 30 to accurately convert the load cell output reading into digital form, this output voltage is preferably ratiometrically compared to the input voltage. Thus, the magnitude of the pulse voltage which generated the load cell output is preferably stored for input into A/D converter 30. When signalled by microprocessor 8, pulse reference 32 measures and stores the voltage applied across terminals A-B. In a preferred embodiment, the signal which initiates storage of the reference voltage is the same as that of S/H signal line 24. Therefore, whenever a load cell output is sampled, pulse reference 32 will be signalled to record the reference voltage as well. The voltage is preferably stored in a capacitor. The reference voltage stored in pulse reference 32 is input into A/D converter 30 along with the filtered load cell output to provide the necessary ratiometric input. A/D converter 30 then converts the load cell analog voltage into a digital reading for the microprocessor 8.

All of the various electrical components of the present invention are preferably located in a common housing or in very close proximity. The heat generated tends to cause the load measurement to drift as a result of the heating effect of the various components, especially the analog devices. Temperature sensor 34 is preferably placed in close proximity to the analog circuitry and load cell 1 to accurately approximate their temperatures. In a preferred embodiment, temperature sensor 34 is an integrated circuit which provides a voltage output proportional to temperature. It is readily foreseen that any appropriate conventional temperature sensor such as thermistor or other device may be utilized in the system of the present invention.

The voltage output of the temperature sensor 34, representative of the circuitry temperature, is selectively routed to A/D converter 30 through the second input of two-input switch 28 under the control of microprocessor 8. The frequency with which a temperature reading is read may be a constant (i.e. every 5 seconds) or may be variable, determined by microprocessor 8. Since temperature changes occur very slowly in contrast with load changes, it is preferable that the temperature be read at a much lower rate than load cell readings. Generally, one reading per minute or less is sufficient. However, in certain conditions it might be desirable to read the temperature value more often. If desired, microprocessor 8 might determine the rate of temperature change, and vary the frequency of temperature readings accordingly. For example, in an embodiment where power to the load cell is constant, i.e. not being pulsed, the load cell 1 will heat up and cause temperature related error. It may therefore be advantageous to take more frequent temperature readings. When no load is present, very infrequent or no temperature readings may be sufficient.

Once A/D converter 30 generates a digital value for the output of temperature sensor 34, this value is read and stored by microprocessor 8. Microprocessor 8 is preferably conventionally programmed with the temperature response characteristics for the system. This is ordinarily accomplished in one of two ways.

Firstly, the entire housing may be placed in a temperature chamber where a look-up table is generated containing the temperature response characteristics for the system over a desired range of temperatures. This look-up table is preferably stored in EEPROM 40.

Alternatively, the transducer 1 may have an associated temperature response equation, or series of coefficients which relate the load cell output to applied load and temperature. These values, ordinarily provided by the load cell manufacturer are preferably stored in EEPROM 40.

Microprocessor 8, having stored values for the system temperature and for the load cell output may determine the weight of the load applied to load cell. This is conventionally accomplished by utilizing either the look-up table or the coefficients as described above. The microprocessor is also able to utilize the system characteristics to compensate for zero drift or span errors, which occur when the load cell output varies with load and temperature. Creep errors may likewise be compensated for. Creep occurs when the load cell output varies with time, temperature and load.

For example, to reduce creep, the microprocessor could store several consecutive output readings and conventionally utilize mathematical algorithms to smooth or average the readings. The use of the microprocessor 8 allows the system of the present invention to compensate for non-linearities in the system and to more accurately correct for span and creep errors.

In order to display the computed load weight, a display 36 is provided. Display 36 ordinarily comprises a plurality of conventional seven-segment LCD's arranged to display a numerical value. Microprocessor 8 preferably contains the necessary LCD driver circuitry to display the load value on the display. Alternatively, driver devices may be provided to display the output in any conventionally known manner.

Figure 4A:
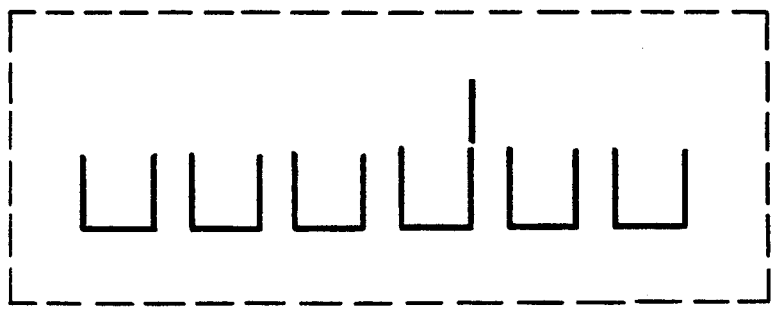
FIGS. 4A–4C are diagrammatic illustrations of the LCD display of the system of FIG. 1 when the system is used as a checkweight indicator.

If desired, however, the system of the present invention may be operated in a checkweight mode. When operated in this mode, a desired weight and desired acceptable range are preferably entered by the system user or may be preset into keys on the display panel. The LCD display circuitry may then preferably be utilized to relay messages to the user. Rather than utilizing additional displays, or additional circuitry, microprocessor 8 may preferably reconfigure the LCD displays for displaying the over/under mode. If the weight present is below the desired tolerance range, the LCD's preferably display lower case U's such as shown in FIG. 4A. A vertical bar preferably indicates how far below the accept range the weight is. Preferably, by way of example, each bar corresponds to 1/12 of the programmable limit.

Figure 4B:
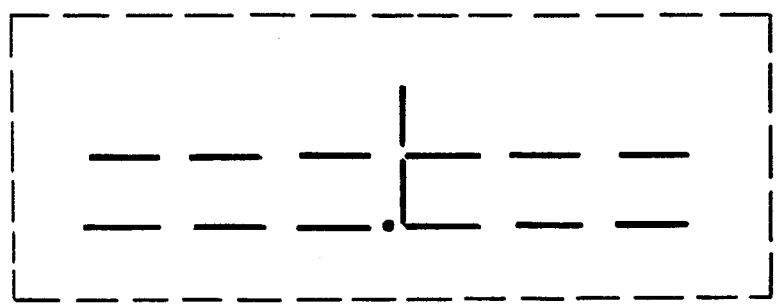

If the weight is within the accept range, preferably horizontal bars appear, with the vertical bars indicating where in the accept range the weight is, such as shown in FIG. 4B. A decimal point in the center of the display represents the target weight. Preferably, there are six bars on each side of the target, and each one represents 1/12 of the programmable limit.

Figure 4C:
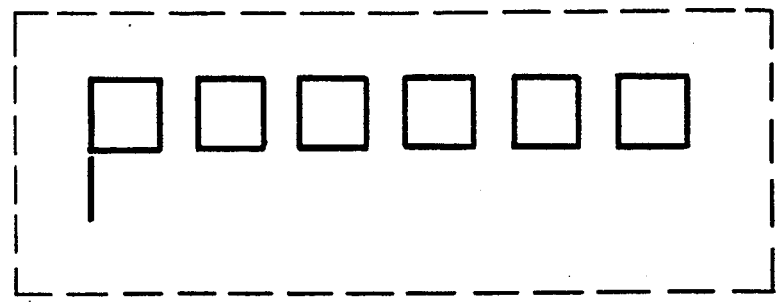

If the weight exceeds the accept range, inverted O's preferably appear, with a vertical bar indicating how far above the accept range the weight is, such as shown in FIG. 4C. Preferably, each bar represents 1/12 of the programmable limit.

Preferably, microprocessor 8 includes the necessary driver circuitry to operate the LCD's in this mode.

For example, if it were desirable to have a scale with 0.5 lb. increments determine when a box was filled to within 12 lb. of 100 lb. target, the display as shown in FIGS. 4A–4C might be used. If the weight were 10 lbs. under the target, the UNDER display indicated at FIG. 4A would be shown. FIG. 4B shows the ACCEPT display and indicates a weight 0-1 lbs. over the target value. FIG. 4C represents an OVER display, and shows approximately 6 lbs. over the target. While the system of the present invention includes various new and useful features, it is readily foreseen that a system may be designed which utilizes only certain of these features. For example, if power is not a consideration for the scale so that pulsing is less advantageous, it would still be useful to employ a single temperature sensor for compensating for all of the components, or to implement the present novel over/under indicator.

Figure 2:
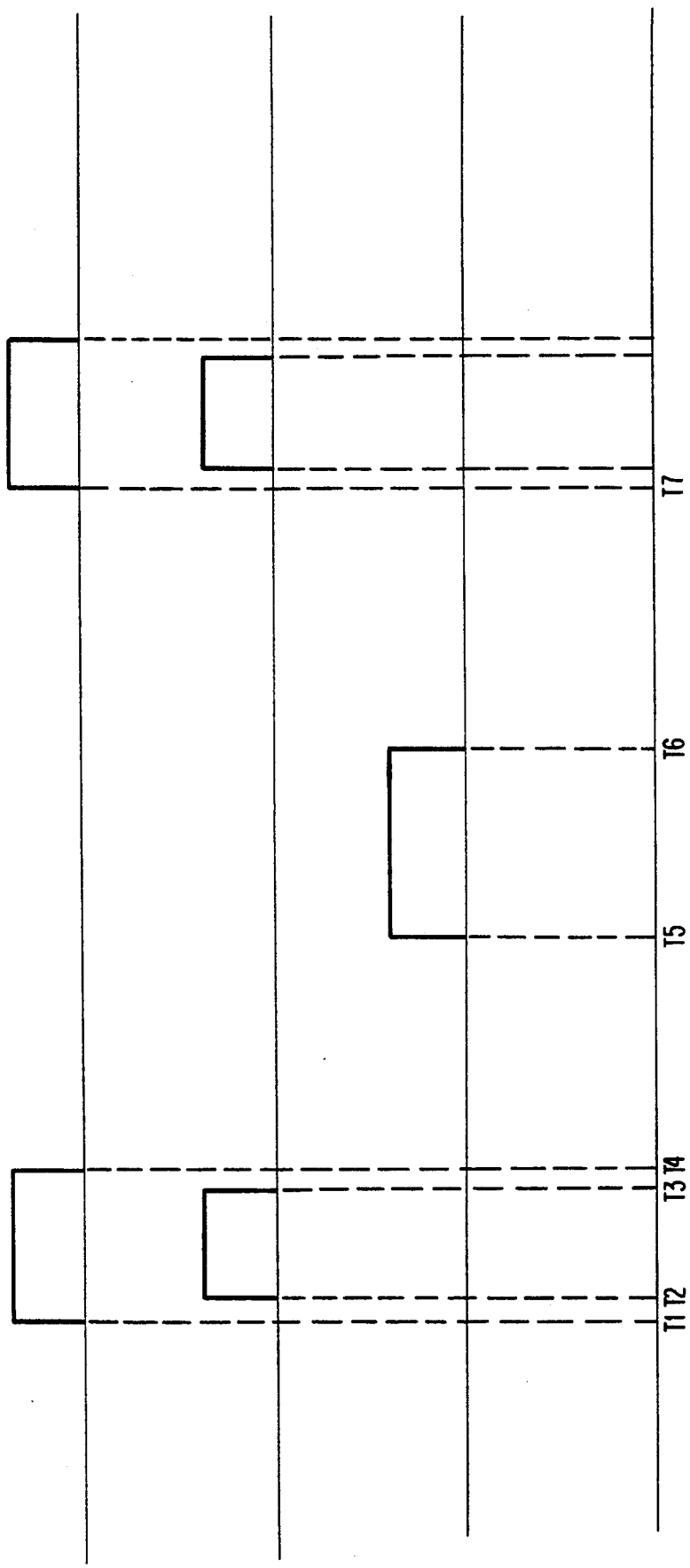
FIG. 2 shows a timing diagram for the electronic measuring system of FIG. 1.

As shown in FIG. 2 microprocessor 8 must properly time the signals to the various devices for the system to operate correctly. In operation, microprocessor 8 would determine the optimal frequency and pulse width for the pulses to load cell 1 based upon desired resolution, battery life and other factors. To initiate the first pulse at time t1, microprocessor 8 sends a DC signal through pulse signal line 10 which closes switches 4 and 6 and thereby supplies power to load cell 1. A short time after the start of the pulse, at time t2, microprocessor 8 sends a DC signal through S/H signal line 24 to sample the load cell output. Substantially simultaneously, pulse reference 32 is signalled by the same S/H signal line 24 to take a measurement of the pulse voltage. If desired, microprocessor 8 may include a separate signal line for pulse reference 32. Time t2 may be any time after time t1, provided that the load cell is still being pulsed until a stable sample is taken, and that the input amplifier, load cell and zero circuitry have had sufficient time to stabilize. After a sufficient time has passed to take an accurate sample, time t3, S/H signal line 24 may be set to zero by microprocessor 8. Any time thereafter, at time t4, pulse signal line 10 may be set to zero, and the pulse ended. Thus time t1–t4 represents the pulse-width of the pulse.

After the pulse has ended, microprocessor 8 sends a DC signal through the zero signal line 20 at time t5. This actuates a switch which will store residual voltages in a capacitor. This line must be kept on for a sufficient time, until time t6, for the storage capacitor to charge. Further, the zero reading must be taken sufficiently close to the next pulse so that the capacitor will not discharge before the next S/H reading. At time t7, the pulse sequence begins again. Thus the interval of pulses is t1–t7, and the frequency is 1/(t1–t7).

The system of the present invention preferably includes an additional feature to preserve power. Most scales are actually used for measurements only a small percentage of the time which power is actually on. Therefore, the present invention preferably includes a sleep mode to conserve power during periods of non-use. The microprocessor 8 is preferably provided with a program to determine when to place the system in the sleep mode. For example, during periods of non-use longer than a desired threshold or in response to an input from the keyboard, microprocessor 8 may initiate the sleep mode.

In the sleep mode, power is cut off from all circuitry which is not necessary. In a preferred embodiment, when the sleep mode is initiated the following events occur: 1) The power supply is signalled to reduce system voltage from +5 VDC to +3 VDC; 2) power to the voltage inverter (provides −5 VDC source) is shut off; 3) all power to the load cell, the sample and hold, the amplifier, the zero circuitry, the pulse reference and the A/D converter is terminated. It is readily foreseen that various combinations of circuitry may be shut off while the system is in the sleep mode. While system response is slow in the sleep mode due to the reduced voltage to the microprocessor, power consumption is significantly reduced.

The sleep mode may be terminated by either a user input, or by placing an object on the scale. If the system is attached to a separate computer, control signals to terminate the sleep mode may be externally provided.

Figure 3A:
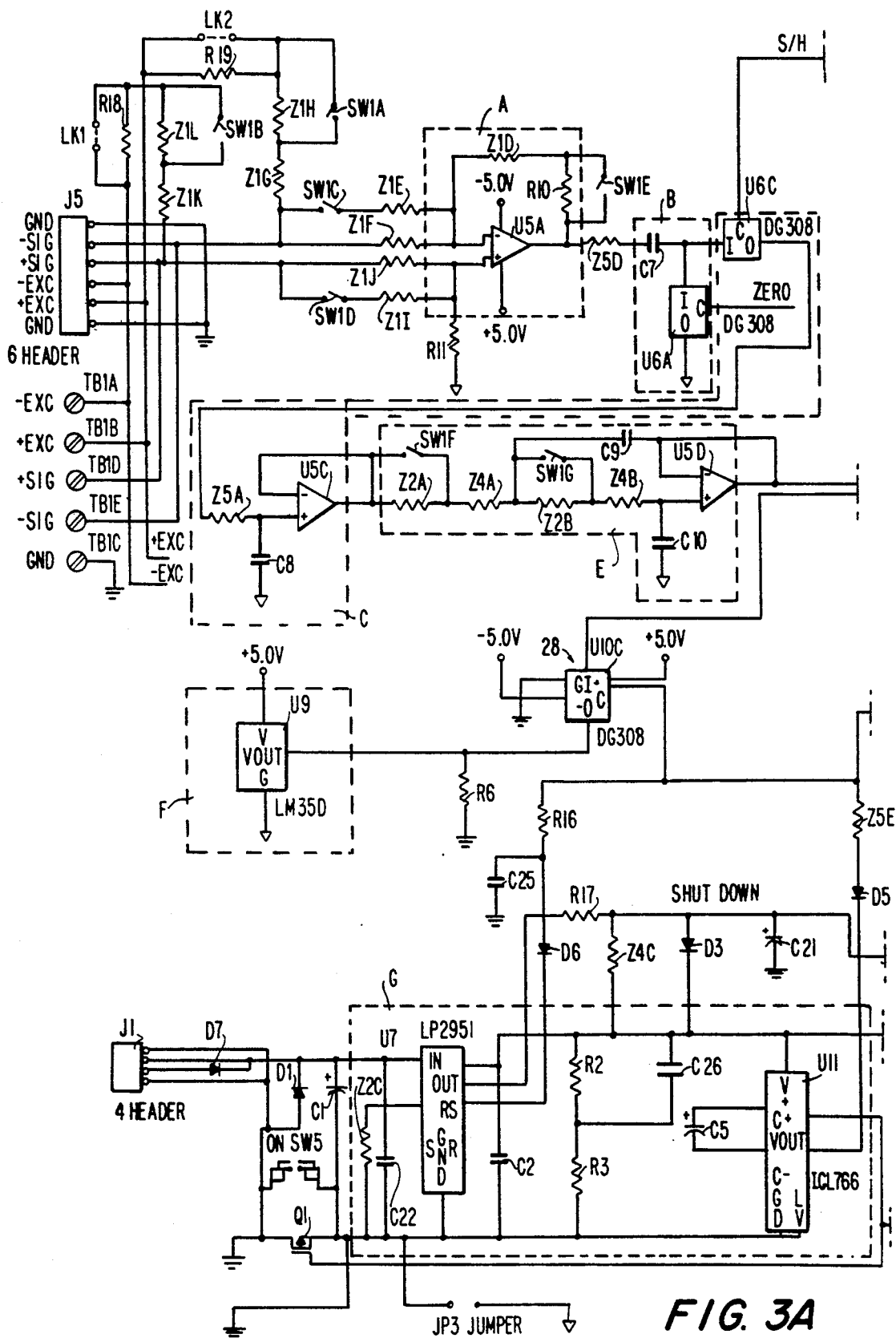
FIG. 3 is a schematic circuit diagram of the electronic measuring system of FIG. 1.
Figure 3B:
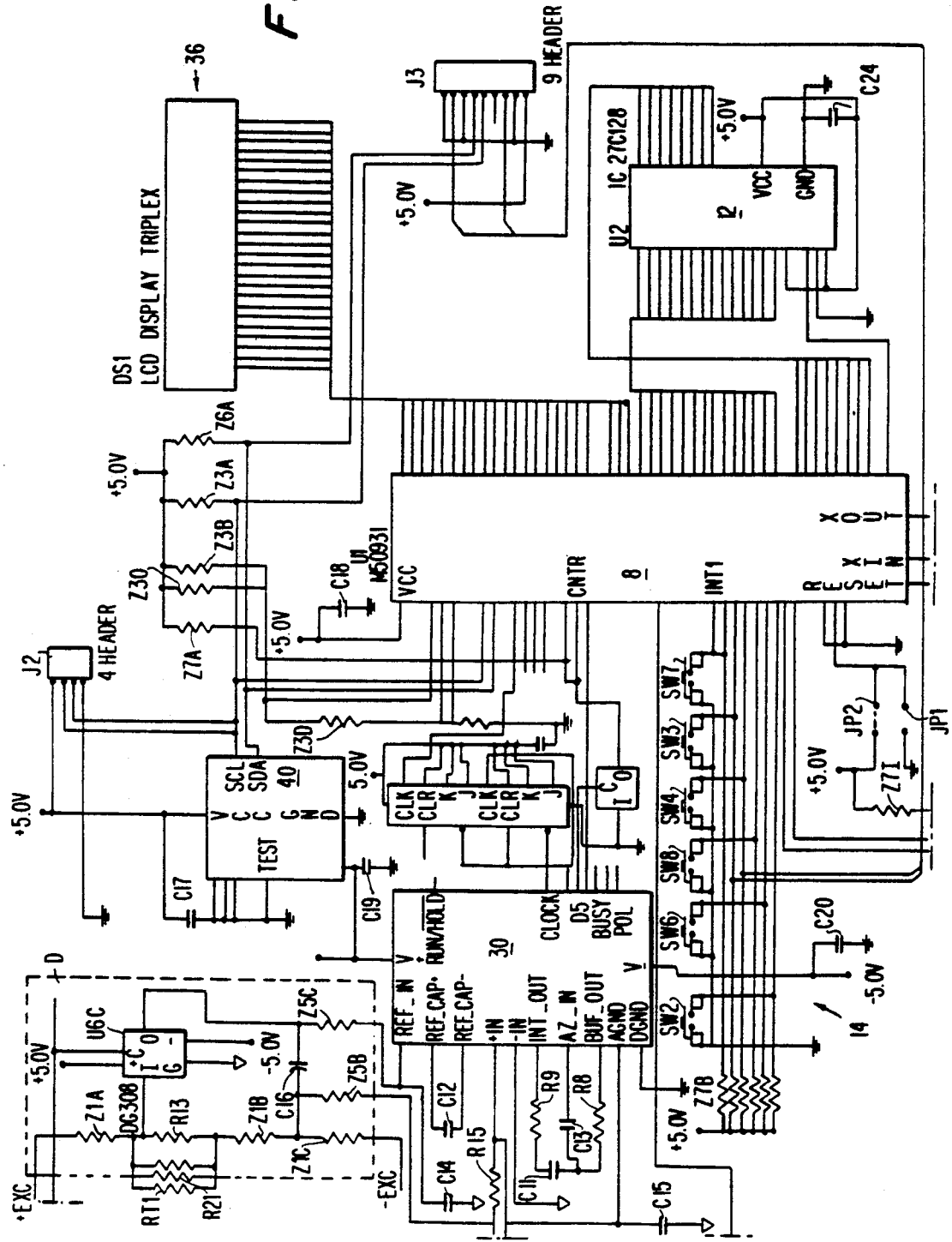
Figure 3C:
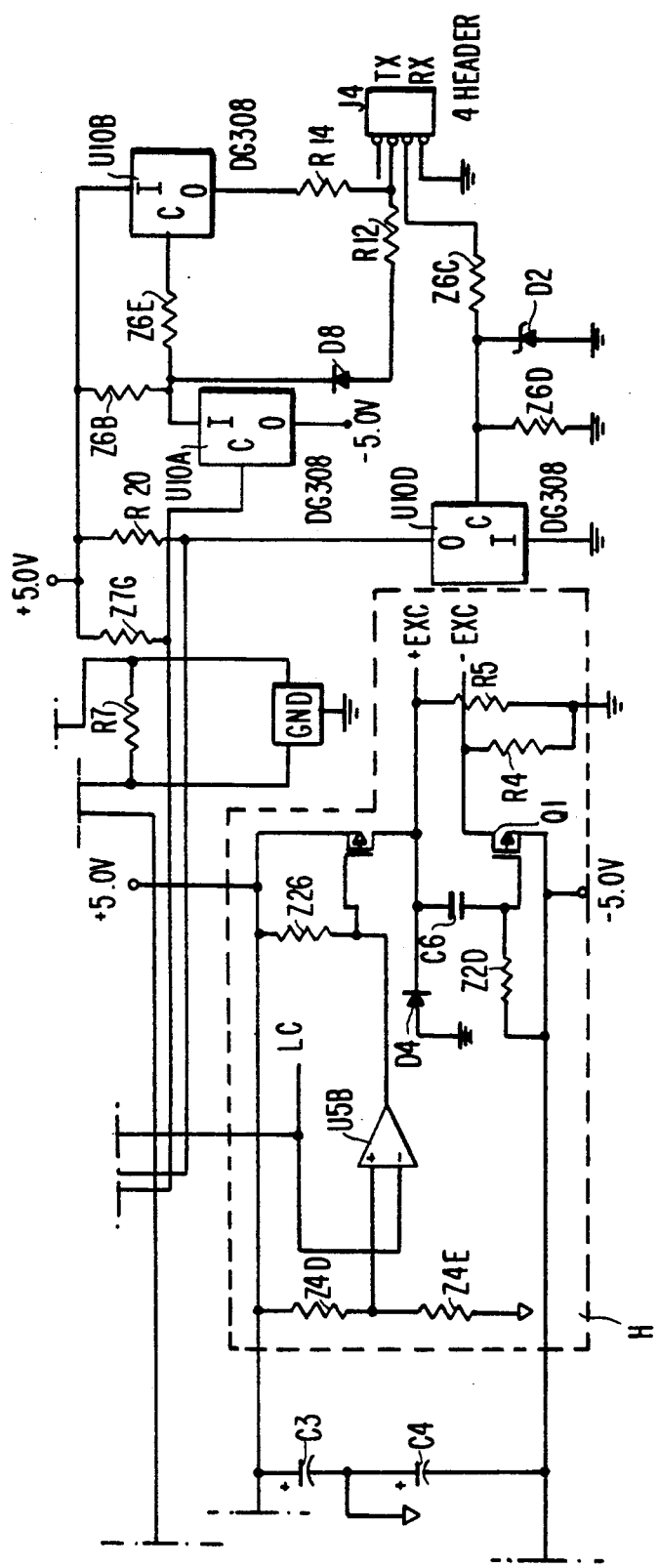

FIG. 3 shows a schematic diagram of a preferred embodiment of the system of FIG. 1. Certain components have been placed in boxes for simplified reference. Box A contains the amplifier circuitry for amplifying the load cell 1 (not shown) output. Box B contains the drift correction circuitry, including capacitor C7 which stores the residual system voltages, and the zero signal line 20.

Box C visualizes the sample-and-hold circuitry including the S/H signal line 24. Box D contains pulse reference 32 circuitry. The pulse reference voltage is stored in capacitor C16. S/H signal line 24 is connected to a switch in both the S/H circuitry, and the pulse reference circuitry. Therefore, when this line is activated, a sample of the load cell output is taken, and a sample of the pulse reference is taken.

Low-pass filter 26 is contained in Box E. The filter output is connected to A/D converter 30 as is the pulse reference output. Box F contains the temperature sensor 34. The temperature sensor output is directed to a microprocessor controlled switch which determines if the temperature sensor output will be directed to A/D converter 30.

The power supply circuitry is substantially contained in Box G. Voltage regulator U7 controls the provision of the necessary DC voltages for the system to be operated, and the voltage inverter U11 provides the negative voltages for the system. These voltages are directed toward the pulse circuitry located in Box H. FET's Q2 and Q3 correspond with switches 4 and 6 as previously described.

Microprocessor 8 is connected to ROM 12 for storing the fixed system program, and EEPROM for storing any particular characteristics of the actual system; i.e., load cell coefficients or temperature sensor characteristics. A control line on pin 19 of microprocessor 8 handles multiple functions. When the microprocessor 8 determines that it is appropriate for the system to enter the sleep mode, this line is actuated to reduce the system voltage and to disengage the inverter U11. However, if this line is only pulsed for a short time, it engages the switch connected to the temperature sensor 34 so that the temperature reading is directed to the A/D converter 30. Preferably, this signal line is not actuated long enough for the system voltage to change, or for the inverter U11 to turn off.

Figure 5:
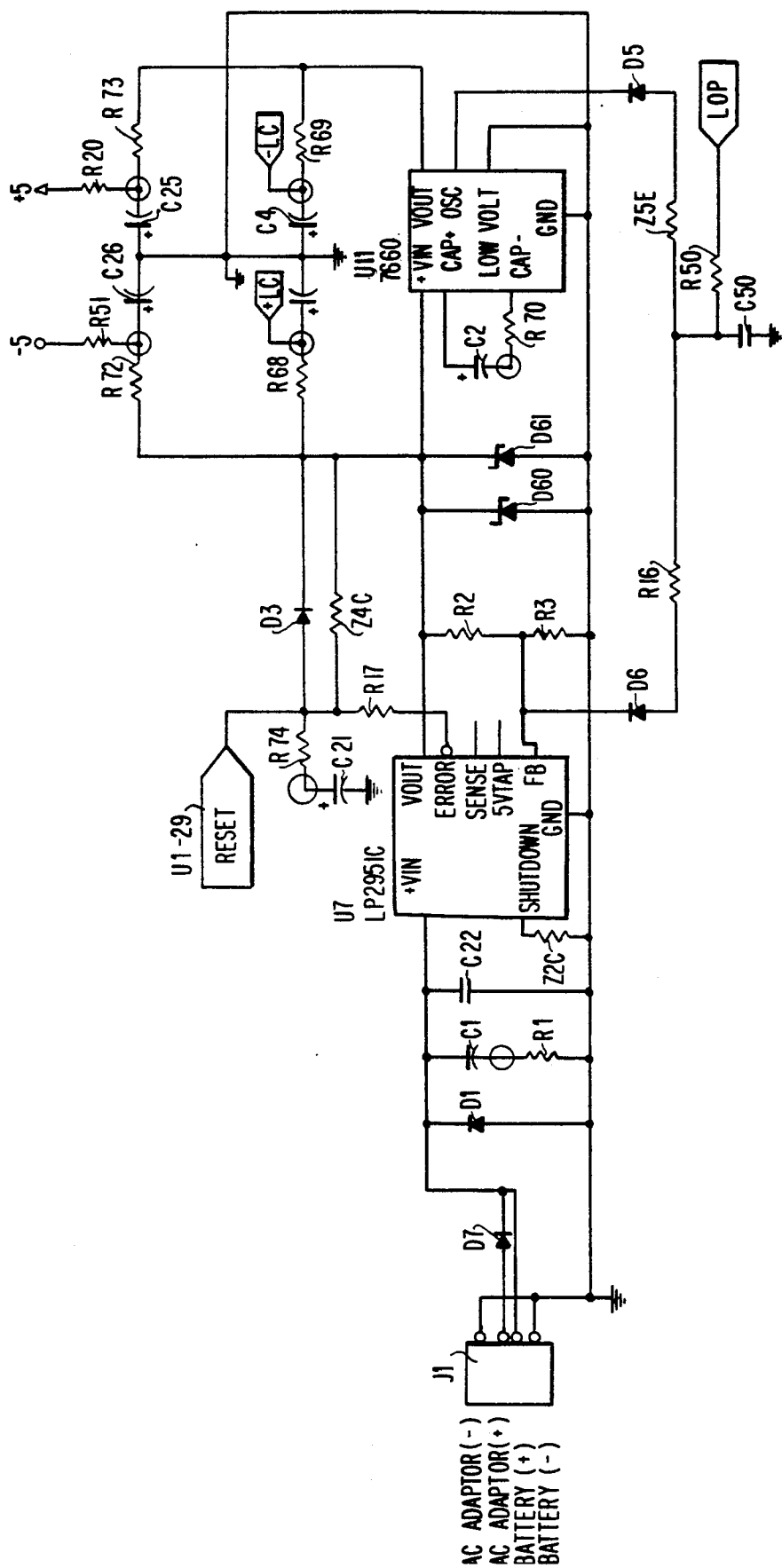
FIG. 5 is a schematic circuit diagram of an embodiment of the present invention suitable for use in high explosive environments.

Another advantage of the electronic measuring system of the present invention is that it is suitable for use in high explosive environments. In such environments, it is necessary to prevent a spark from occurring anywhere on the circuit boards. Since the present invention operates on low voltages and generates lower heat than previous scales, it is useful in such environments. As shown in FIG. 5, by modifying the circuitry slightly, sparks even due to component failures are eliminated. Redundant zener diodes D60 an D61 insure that if voltage regulator U7 fails, a resultant voltage spike will not result in a spark. Further safety is achieved by placing current limiting resistors in series with any capacitor which could discharge with sufficient charge to spark. Resistors R1, R74, R68, R69, R72, R73, and R70, for example, help eliminate potentially catastrophic stray sparks.

Although the present invention has been described in detail with respect to certain embodiments and examples, variations and modifications exist which are within the scope of the present invention as defined in the following claims.

What is claimed:

1. In an electronic measuring system comprising measuring transducer means operative when electrically powered to provide an electrical measurement signal output indicative of the magnitude of an entity being measured thereby; power means for providing power for said measuring system; control means operating to provide spaced energizing pulses from said power means to said measuring transducer means to cause said transducer means to provide a pulsed electrical measurement signal; and indicator means operative to receive said electrical measurement signal for providing an indication of the magnitude of the entity being measured at a predetermined resolution; the improvement comprising microprocessor means for determining an optimal pulse width and interval for each of said energizing pulses in accordance with said predetermined resolution for said measurement signal; and means operatively connected to said microprocessor means for varying said predetermined resolution, said microprocessor pulse width and interval determining means comprising means for determining an optimal frequency and duty cycle for said predetermined resolution and for varying said frequency and duty cycle in accordance with variations in said predetermined resolution for providing a variable pulse control signal to said control means in accordance with said variations in said predetermined resolution, said control means variably pulsing said measuring transducer means in response to said variable pulse control signal for pulsing said measuring transducer means in accordance with said predetermined resolution at any given time; whereby said system power is preserved by pulsing said measuring transducer means only when necessary in accordance with said resolution.

2. An improved electronic measuring system in accordance with claim 1 wherein said measuring transducer means comprises a load cell.

3. An improved electronic measuring system in accordance with claim 2 wherein said means for varying said frequency and duty cycle comprises means for increasing the duty cycle in response to increases in said predetermined resolution.

4. An improved electronic measuring system in accordance with claim 3 wherein said means for varying said frequency and duty cycle comprises means for decreasing the duty cycle in response to decreases in said predetermined resolution.

5. An improved electronic measuring system in accordance with claim 2 wherein said means for varying said frequency and duty cycle comprises means for decreasing the duty cycle in response to decreases in said predetermined resolution.

6. An improved electronic measuring system in accordance with claim 1 wherein said means for varying said frequency and duty cycle comprises means for decreasing the duty cycle in response to decreases in said predetermined resolution.

7. An improved electronic measuring system in accordance with claim 1 wherein said means for varying said frequency and duty cycle comprises means for increasing the duty cycle in response to increases in said predetermined resolution.

8. An improved electronic measuring system in accordance with claim 7 wherein said means for varying said frequency and duty cycle comprises means for decreasing the duty cycle in response to decreases in said predetermined resolution.

9. An improved electronic measuring system in accordance with claim 1 further comprising drift correction means operatively connected to said measuring transducer means output for storing any residual voltages which remain between pulses to said measuring transducer means and for subtracting said stored residual voltage from said electrical measurement signal during the next successive pulse from said power means to said measuring transducer means for providing a zero correction for said electrical measurement signal.

10. An improved electronic measuring system in accordance with claim 9 wherein said microprocessor means further comprising means for variably providing a drift correction control signal to said drift correction means in response to variations in said duty cycle for increasing occurrence of said zero corrections in response to increases in said duty cycle.

11. An improved electronic measuring system in accordance with claim 1 further comprising noise filtering means operatively connected to said measuring transducer means output for substantially filtering out any noise content in said electrical measurement signal.

12. An improved electronic measuring system in accordance with claim 1 wherein said electronic measuring system comprises a housing, said indicator means and said measuring transducer means being contained in said housing, said housing further including a common temperature sensing means disposed in close proximity to both said indicator means and said measuring transducer means for simultaneously sensing any heat generated within said housing by said measuring transducer means and said indicator means for enabling temperature compensation therefor in said electrical measurement signal provided to said indicator means.

13. An improved electronic measuring system in accordance with claim 12 wherein said measuring transducer means comprises a load cell.

14. An improved electronic measuring system in accordance with claim 13 wherein said load cell comprises an analog load cell, said indicator means comprising analog-to-digital conversion means for converting said analog electrical measurement signal into a digital display.

15. An improved electronic measuring system in accordance with claim 13 wherein said load cell comprises a digital load cell.

16. An improved electronic measuring system in accordance with claim 1 wherein electronic measuring system comprises a checkweigher, said indicator means comprising over/under indicator means.

17. An improved electronic measuring system in accordance with claim 16 wherein said indicator means comprises visual display means for displaying said magnitude of the entity being measured, said over/under indicator means comprising segmented portions of said visual display means for selectively displaying an over indication, an under indication or an acceptable indication on said visual display means by selectively illuminating said segmented portions.

18. An improved electronic measuring system in accordance with claim 17 wherein said visual display means comprises LCD means.

19. An improved electronic measuring system in accordance with claim 18 wherein said over/under indicator means further comprises means for selectively displaying a moving over/under indication within a predetermined range of values.

20. An improved electronic measuring system in accordance with claim 17 wherein said over/under indicator means further comprises means for selectively displaying a moving over/under indication within a predetermined range of values.

21. An improved electronic measuring system in accordance with claim 1 further comprising spark prevention means for preventing the occurrence of electrical sparking in said measuring system, said electronic measuring system being adapted for use in high explosive environments.

22. An electronic measuring system comprising measuring transducer means operative when electrically powered to provide an electrical measurement signal output indicative of the magnitude of an entity being measured thereby; indicator means operative to receive said electrical measurement signal for providing a visual display indication with respect to said magnitude of said entity being measured in response to said electrical measurement signal; and display control means operatively connected between said measuring transducer means and said indicator means for selectively providing a display control signal to said indicator means for controllably providing an over/under visual display indication in a checkweigher mode of said measuring system in response to said electrical measurement signal and a magnitude visual display indication of said magnitude of said entity in a weight display mode of said measuring system in response to said electrical measurement signal, said indicator means comprising visual display means, said visual display means comprising a plurality of selectively illuminable segmented portions for selectively displaying said over/under visual display indication or said magnitude visual display indication in response to said display control signal dependent on said mode of said measurement system, said visual display means selectively illuminating a portion of said segmented portions for providing said over/under indication in said checkweigher mode.

23. An electronic measuring system in accordance with claim 22 wherein said over/under visual display indication comprises a separate over visual display indication, a separate under visual display indication, and a separate acceptable visual display indication, said visual display selectively illuminating different portions of said segmented portions for providing said separate over/under visual display indications in response to said display control signal.

24. An electronic measuring system in accordance with claim 23 wherein said visual display means comprises LCD means.

25. An electronic measuring system in accordance with claim 24 wherein said visual display means further comprises means for selectively displaying a moving over/under visual display indication within a predetermined range of values in said checkweigher mode in response to said display control signal.

26. An electronic measuring system in accordance with claim 22 wherein said visual display means further comprises means for selectively displaying a moving over/under visual display indication within a predetermined range of values in said checkweigher mode in response to said display control signal.

27. An electronic measuring system in accordance with claim 22 further comprising spark prevention means for preventing the occurrence of electrical sparking in said measuring system, said electronic measuring system being adapted for use in high explosive environments.

28. An electronic measuring system in accordance with claim 23 wherein said visual display means further comprises means for selectively displaying a moving over/under visual display indication within a predetermined range of values in said checkweigher mode in response to said display control signal.

29. An electronic measuring system in accordance with claim 22 wherein said visual display means comprises LCD means.

* * * * *